(12) United States Patent
Hirler et al.

(10) Patent No.: US 9,773,863 B2
(45) Date of Patent: Sep. 26, 2017

(54) VDMOS HAVING A NON-DEPLETABLE EXTENSION ZONE FORMED BETWEEN AN ACTIVE AREA AND SIDE SURFACE OF SEMICONDUCTOR BODY

(71) Applicant: Infineon Technologies Austria AG, Villach (AT)

(72) Inventors: Franz Hirler, Isen (DE); Stefan Gamerith, Villach (AT); Joachim Weyers, Hoehenkirchen-Siegertsbrunn (DE); Wolfgang Jantscher, Villach (AT); Waqas Mumtaz Syed, Villach (AT)

(73) Assignee: Infineon Technologies Austria AG, Villach (AT)

( * ) Notice: Subject to any disclaimer, the term of this patent is extended or adjusted under 35 U.S.C. 154(b) by 60 days.

(21) Appl. No.: 14/277,169

(22) Filed: May 14, 2014

(65) Prior Publication Data
US 2015/0333168 A1    Nov. 19, 2015

(51) Int. Cl.
*H01L 29/78*     (2006.01)
*H01L 29/06*     (2006.01)
(Continued)

(52) U.S. Cl.
CPC ...... *H01L 29/0634* (2013.01); *H01L 29/0615* (2013.01); *H01L 29/0653* (2013.01); *H01L 29/4238* (2013.01); *H01L 29/7397* (2013.01); *H01L 29/7802* (2013.01); *H01L 29/7809* (2013.01); *H01L 29/7811* (2013.01); *H01L 29/7813* (2013.01); *H03K 17/687* (2013.01); *H01L 29/063* (2013.01);
(Continued)

(58) Field of Classification Search
CPC ............. H01L 29/0653; H01L 29/7802; H01L 29/0619; H01L 29/402; H01L 29/7811; H01K 17/687
See application file for complete search history.

(56) References Cited

U.S. PATENT DOCUMENTS 6,498,368 B2 * 12/2002 Sakamoto ............. H01L 29/872
                                                     257/341
6,630,698 B1 * 10/2003 Deboy ................ H01L 29/0634
                                                     257/285
(Continued)

FOREIGN PATENT DOCUMENTS

DE          10066053 A1      6/2002
DE       102005038260 B3      3/2007

*Primary Examiner* — Ahn Mai
(74) *Attorney, Agent, or Firm* — Murphy, Bilak & Homiller, PLLC

(57) ABSTRACT

A semiconductor device includes a semiconductor body with transistor cells arranged in an active area and absent in an edge area between the active area and a side surface. A field dielectric adjoins a first surface of the semiconductor body and separates, in the edge area, a conductive structure connected to gate electrodes of the transistor cells from the semiconductor body. The field dielectric includes a transition from a first vertical extension to a second, greater vertical extension. The transition is in the vertical projection of a non-depletable extension zone in the semiconductor body, wherein the non-depletable extension zone has a conductivity type of body/anode zones of the transistor cells and is electrically connected to at least one of the body/anode zones.

18 Claims, 14 Drawing Sheets

(51) Int. Cl.
  H03K 17/687  (2006.01)
  H01L 29/423  (2006.01)
  H01L 29/739  (2006.01)
  *H01L 29/40*  (2006.01)
  *H01L 29/10*  (2006.01)

(52) U.S. Cl.
  CPC ...... *H01L 29/0619* (2013.01); *H01L 29/0623* (2013.01); *H01L 29/1095* (2013.01); *H01L 29/402* (2013.01)

(56) References Cited

U.S. PATENT DOCUMENTS

| | | | |
|---|---|---|---|
| 6,639,272 B2 | 10/2003 | Ahlers et al. | |
| 7,042,046 B2 | 5/2006 | Onishi et al. | |
| 7,161,209 B2 | 1/2007 | Saito et al. | |
| 7,622,771 B2 | 11/2009 | Ono et al. | |
| 7,737,469 B2* | 6/2010 | Saito | H01L 29/872 257/197 |
| 7,973,362 B2* | 7/2011 | Willmeroth | H01L 29/0634 257/329 |
| 8,093,676 B2 | 1/2012 | Schmidt | |
| 2004/0125968 A1 | 7/2004 | Pearce et al. | |
| 2006/0157813 A1* | 7/2006 | Saito | H01L 29/0634 257/498 |
| 2006/0261375 A1 | 11/2006 | Wahl et al. | |
| 2008/0237852 A1* | 10/2008 | Yoshida | H01L 24/05 257/737 |
| 2009/0096030 A1* | 4/2009 | Ishida | H01L 29/0634 257/368 |
| 2011/0140198 A1* | 6/2011 | Inagawa | H01L 27/0629 257/330 |
| 2012/0126328 A1* | 5/2012 | Lin | H01L 29/0634 257/368 |
| 2013/0075760 A1* | 3/2013 | Takaya | H01L 29/0623 257/77 |
| 2013/0075819 A1* | 3/2013 | Takei | H01L 29/0619 257/355 |
| 2013/0119432 A1* | 5/2013 | Lu | H01L 29/0619 257/139 |
| 2013/0249001 A1 | 9/2013 | Willmeroth et al. | |
| 2014/0231928 A1 | 8/2014 | Willmeroth et al. | |
| 2015/0001552 A1* | 1/2015 | Hori | H01L 29/872 257/77 |
| 2015/0043116 A1 | 2/2015 | Weyers et al. | |
| 2015/0295028 A1* | 10/2015 | Kagata | H01L 29/861 257/330 |
| 2015/0333169 A1* | 11/2015 | Willmeroth | H01L 29/7802 257/329 |

* cited by examiner

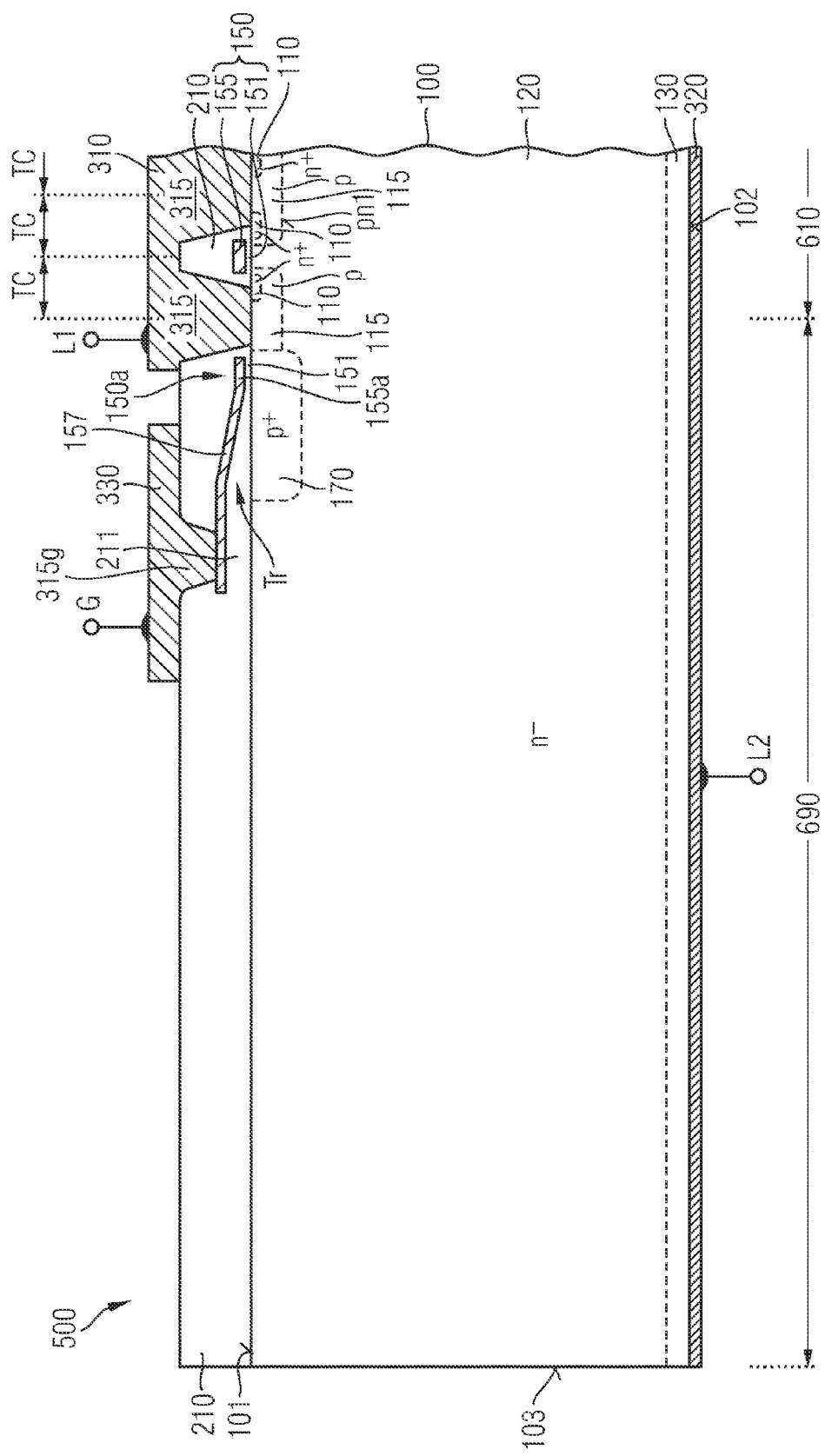

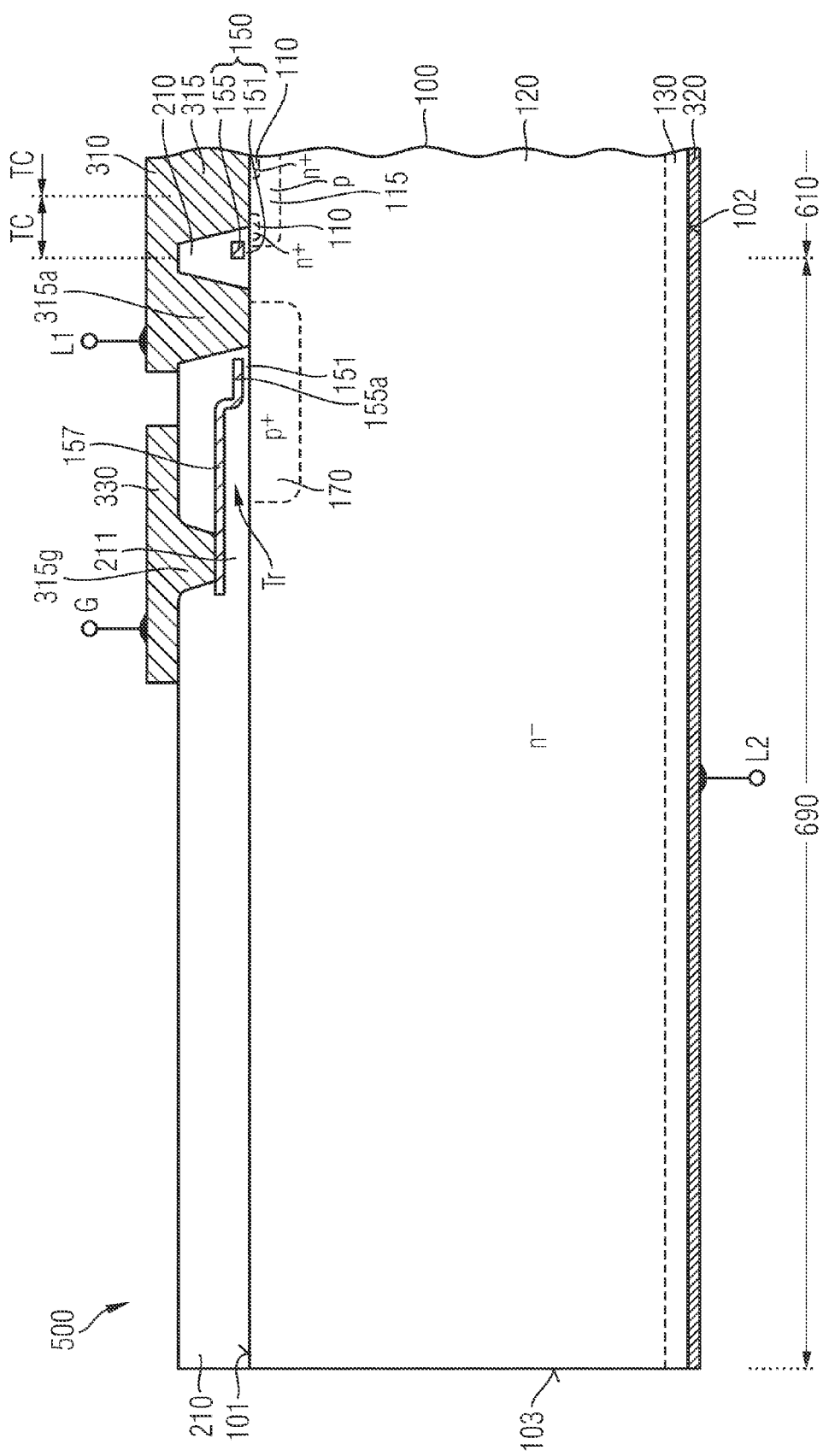

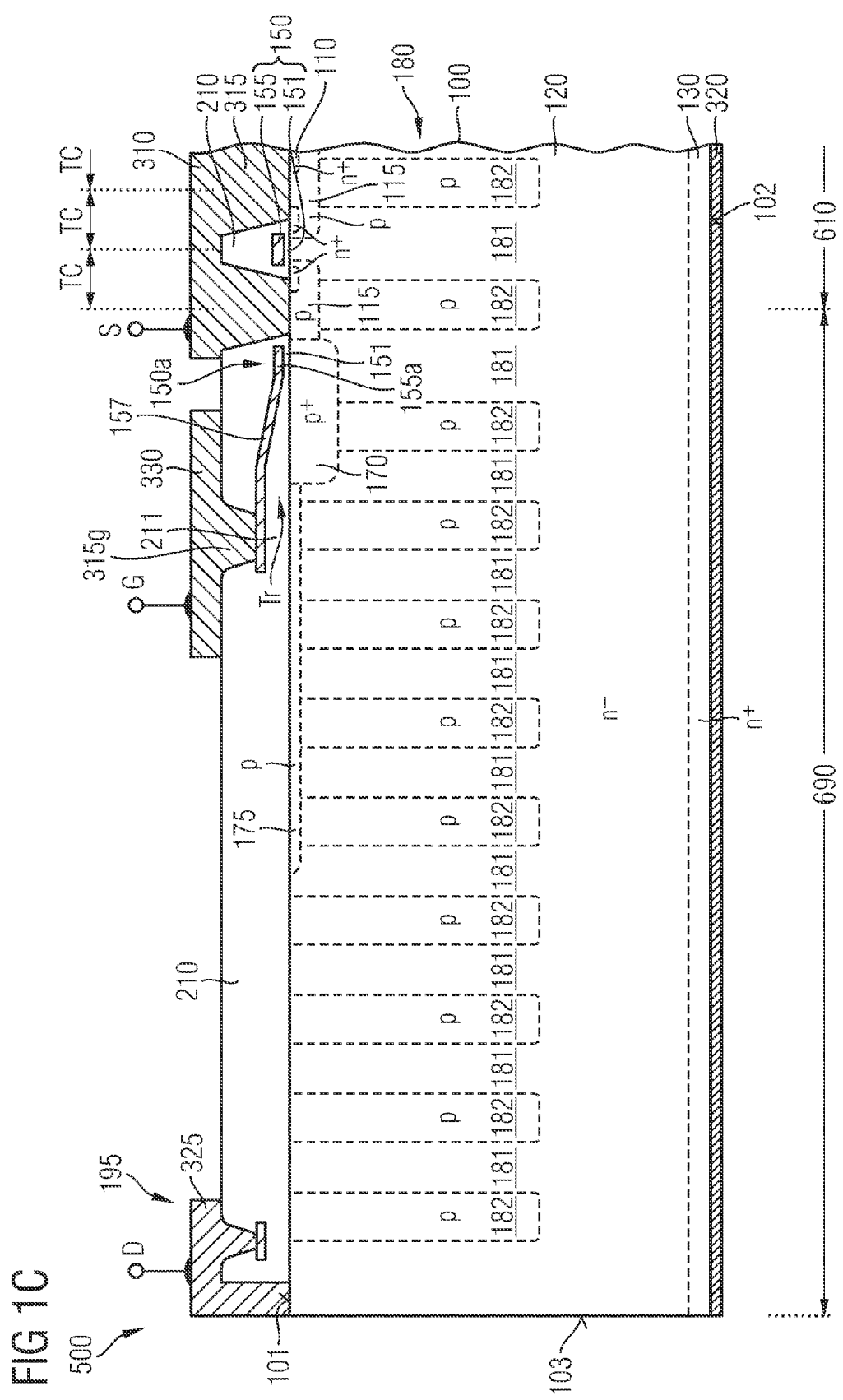

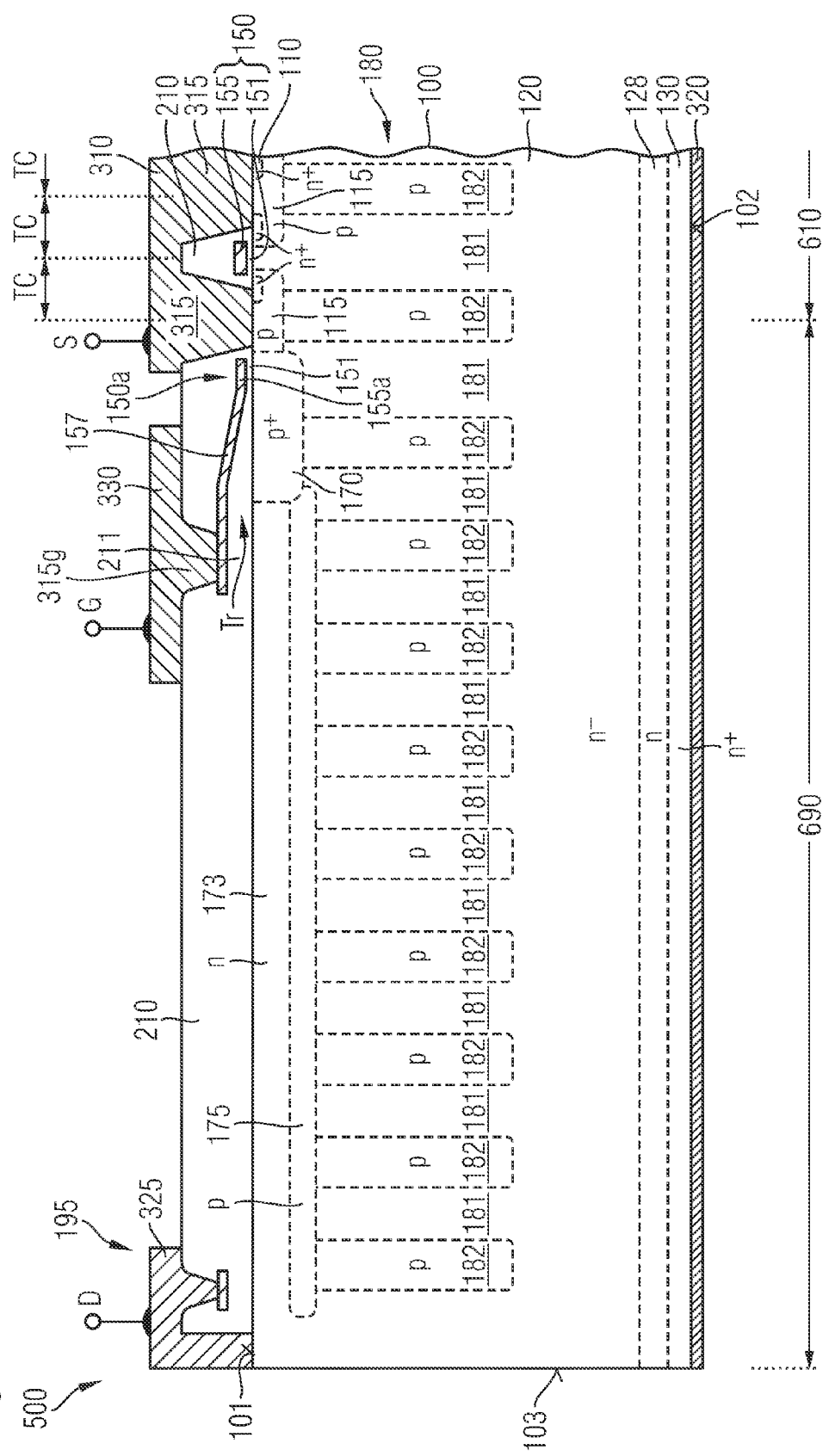

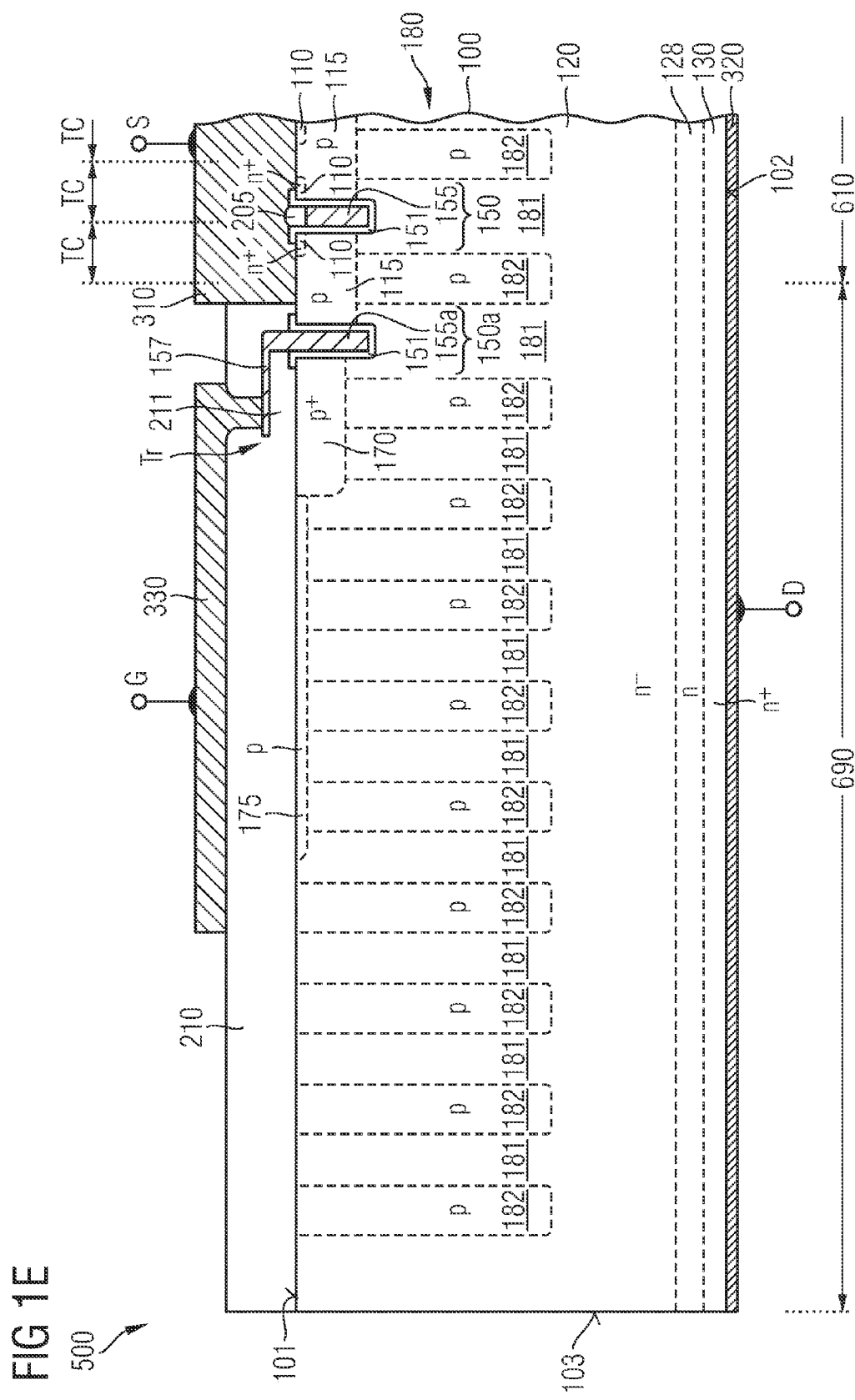

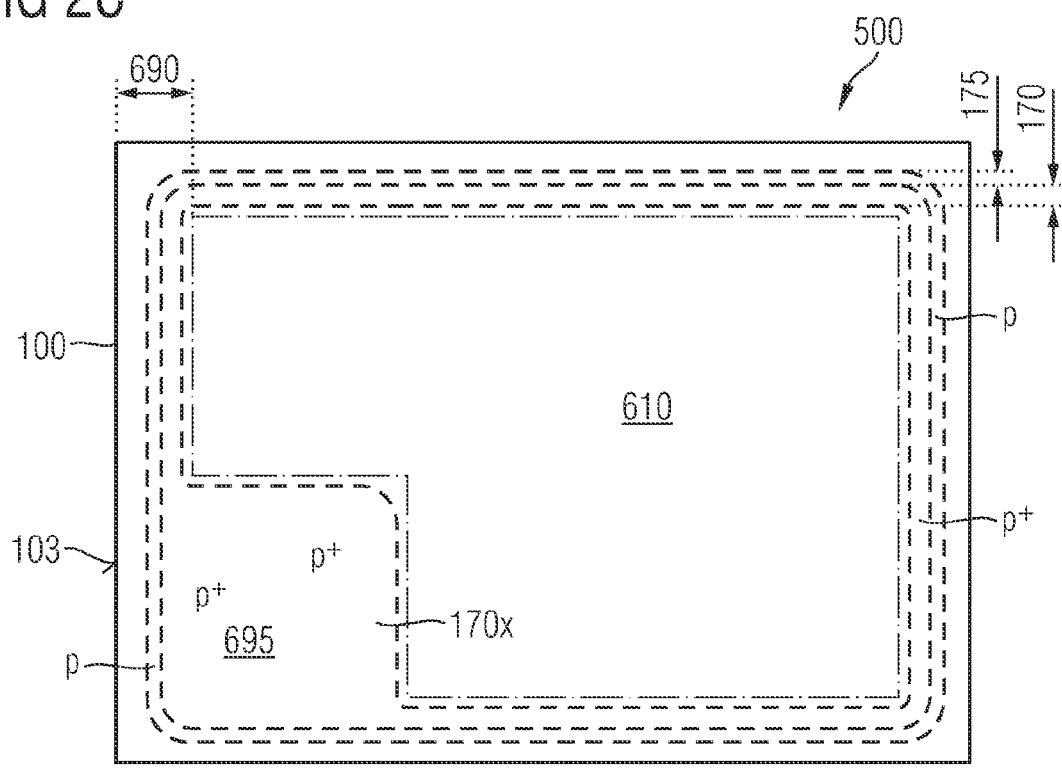

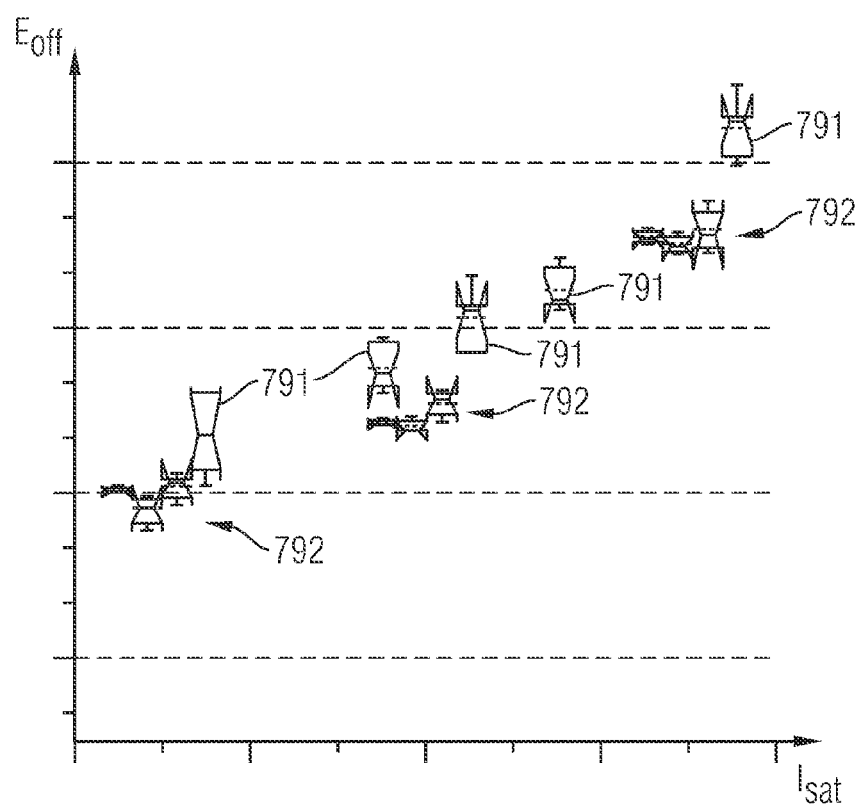

VDMOS HAVING A NON-DEPLETABLE EXTENSION ZONE FORMED BETWEEN AN ACTIVE AREA AND SIDE SURFACE OF SEMICONDUCTOR BODY

BACKGROUND

Applications like half bridge circuits use a body diode between a body and a drift zone in a semiconductor body of a semiconductor switching device as a freewheeling diode in the reverse mode of the switching device. In the forward-biased mode of the body diode holes and electrons injected into the drift zone form a high density charge carrier plasma that results in a low forward voltage drop of the body diode. A significant portion of the charge carrier floods an edge area separating an active area including transistor cells from a side surface of the semiconductor body. When the switching device changes from reverse-biased to forward-biased, the body diode changes from forward-biased to reverse-biased and mobile charge carriers are removed from the drift zone.

It is desirable to provide more reliable semiconductor devices.

SUMMARY

According to an embodiment a semiconductor device includes a semiconductor body with transistor cells arranged in an active area and absent in an edge area between the active area and a side surface of the semiconductor body. A field dielectric adjoins a first surface of the semiconductor body and separates, in the edge area, a conductive structure connected to gate electrodes of the transistor cells from the semiconductor body. The field dielectric includes a transition from a first vertical extension to a second, greater vertical extension. The transition is in the vertical projection of a non-depletable extension zone in the semiconductor body, wherein the non-depletable extension zone has a conductivity type of body/anode zones of the transistor cells and is electrically connected to at least one of the body/anode zones.

According to another embodiment a semiconductor device includes a semiconductor body with transistor cells arranged in an active area and absent in an edge area between the active area and a side surface of the semiconductor body. An interlayer dielectric structure adjoins a first surface of the semiconductor body. In the edge area the interlayer dielectric structure separates a gate construction from the semiconductor body. In the vertical projection of at least a portion of the gate construction in the semiconductor body is a non-depletable extension zone of a conductivity type of body/anode zones of the transistor cells. The non-depletable extension zone is electrically connected to at least one of the body/anode zones.

According to a further embodiment a half-bridge circuit includes a semiconductor body with transistor cells arranged in an active area and absent in an edge area between the active area and a side surface of the semiconductor body. A field dielectric adjoins a first surface of the semiconductor body and separates, in the edge area, a conductive structure from the semiconductor body. The field dielectric includes a transition from a first vertical extension to a second, greater vertical extension. The transition is in the vertical projection of a non-depletable extension zone in the semiconductor body, wherein the non-depletable extension zone has a conductivity type of body/anode zones of the transistor cells and is electrically connected to at least one of the body/anode zones.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a schematic cross-sectional view of a portion of a semiconductor device according to an embodiment related to planar gate electrodes and a stepless transition of a field dielectric between a semiconductor body and a conductive structure.

FIG. 1B is a schematic cross-sectional view of a portion of a semiconductor device according to an embodiment related to planar gate electrodes and a stepped transition of a field dielectric between a semiconductor body and a conductive structure.

FIG. 1C is a schematic cross-sectional view of a portion of a superjunction IGFET according to an embodiment related to planar gate electrodes and a stepless transition of a field dielectric between a semiconductor body and a conductive structure.

FIG. 1D is a schematic cross-sectional view of a portion of a superjunction IGFET according to an embodiment related to a buried depletable extension zone and a stepless transition of a field dielectric between a conductive structure and a semiconductor body.

FIG. 1E is a schematic cross-sectional view of a portion of a superjunction IGFET in accordance with an embodiment related to buried gate electrodes.

FIG. 2C is a schematic lateral cross-sectional view of a semiconductor device in accordance with an embodiment with an enlarged portion of a non-depletable extension zone formed in the vertical projection of a gate construction.

FIG. 4 is a schematic diagram comparing switching-off losses for illustrating effects of the embodiments.

DETAILED DESCRIPTION

Figure 1F:
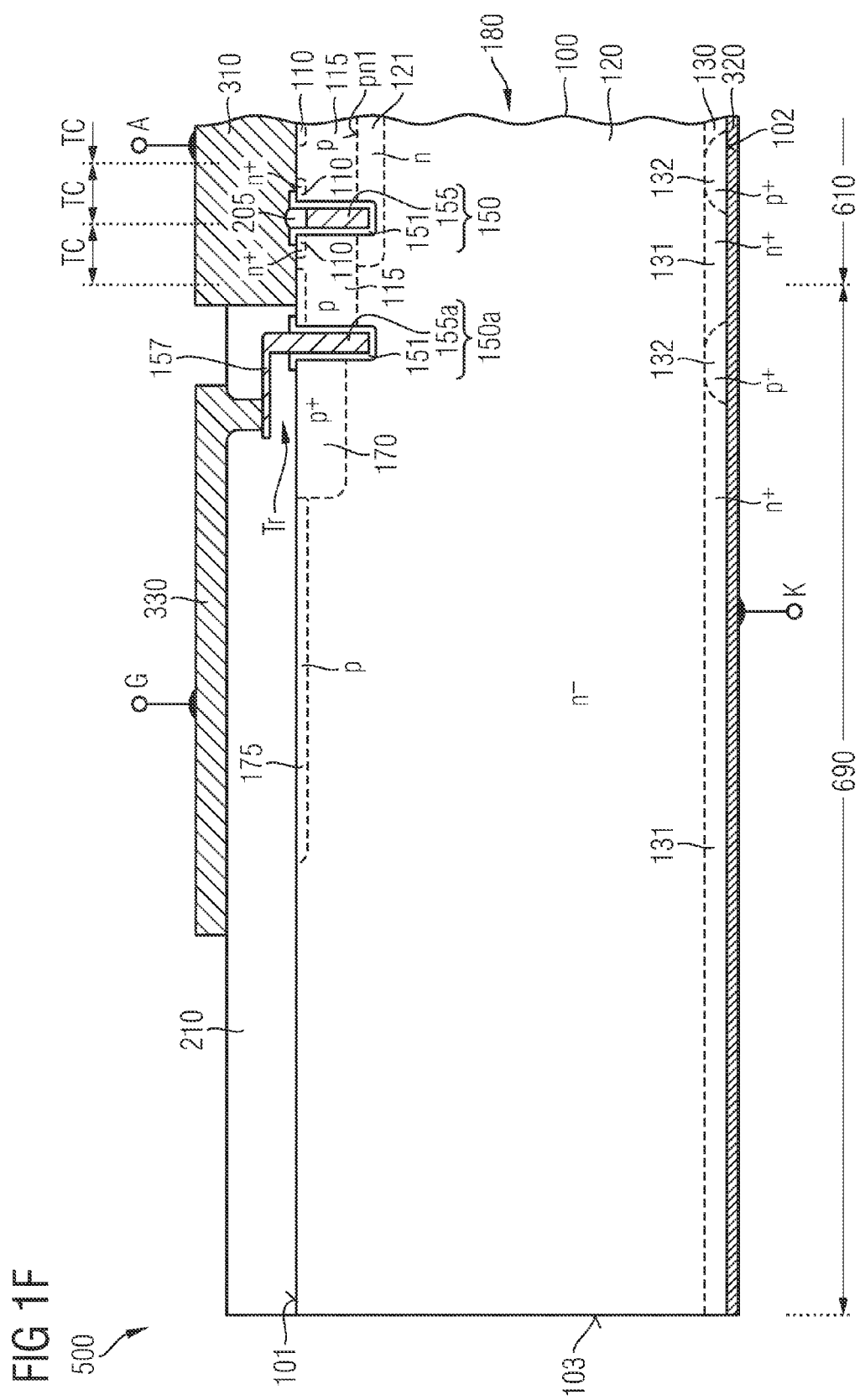
FIG. 1F is a schematic cross-sectional view of a portion of an MCD (MOS-controlled diode) according to another embodiment.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1E refer to controllable semiconductor devices 500 including active transistor cells and/or controllable desaturation or injection cells, for example controllable semiconductor diodes such as MCDs, IGFETs (insulated gate field effect transistors) including MOSFETs (metal oxide semiconductor FETs) in the usual meaning including FETs with metal gates as well as FETs with non-metal gates, JFETs (junction field effect transistors), IGBTs (insulated gate bipolar transistors), and thyristors, by way of example.

Each of the semiconductor devices 500 is based on a semiconductor body 100 from a single-crystalline semiconductor material such as silicon (Si), silicon carbide (SiC), germanium (Ge), a silicon germanium crystal (SiGe), gallium nitride (GaN), gallium arsenide (GaAs) or any other $A_{III}B_v$ semiconductor.

The semiconductor body 100 has a first surface 101 which may be approximately planar or which may be given by a plane spanned by coplanar surface sections as well as a mainly planar second surface 102 parallel to the first surface 101. A minimum distance between the first and second surfaces 101, 102 is selected to achieve a specified voltage blocking capability of the semiconductor device 500. A side surface 103 connects the first and second surfaces 101, 102.

In a plane perpendicular to the cross-sectional plane the semiconductor body 100 may have a rectangular shape with an edge length in the range of several millimeters or may be disc-shaped with a diameter of several centimeters. A normal to the first surface 101 defines a vertical direction and directions orthogonal to the vertical direction are lateral directions.

The semiconductor body 100 includes a drift zone 120 of a first conductivity type as well as a pedestal layer 130 between the drift zone 120 and the second surface 102.

A dopant concentration in the drift zone 120 may gradually or in steps increase or decrease with increasing distance to the first surface 101 at least in portions of its vertical extension. According to other embodiments the dopant concentration in the drift zone 120 may be approximately uniform. A mean dopant concentration in the drift zone 120 may be between $5E12$ $cm^{-3}$ and $1E16$ $cm^{-3}$, for example in a range from $5E13$ $cm^{-3}$ to $5E15$ $cm^{-3}$. The drift zone 120 may include further dopant zones, e.g. a superjunction structure.

The pedestal layer 130 may have the first conductivity type in case the semiconductor device 500 is a semiconductor diode, an IGFET or a JFET, may have a second conductivity type, which is complementary to the first conductivity type, in case the semiconductor device 500 is an IGBT or a thyristor or may contain zones of both conductivity types extending between the drift zone 120 and the second surface 102 in case the semiconductor device 500 is an MCD or an RC-IGBT (reverse conducting IGBT). The dopant concentration in the pedestal layer 130 is sufficiently high to form an ohmic contact with a metal directly adjoining the second surface 102. In case the semiconductor body 100 is based on silicon Si, a mean dopant concentration for a p-type pedestal layer 130 or p-type zones of the pedestal layer 130 may be at least $1E16$ $cm^{-3}$, for example at least $5E17$ $cm^{-3}$.

The semiconductor devices 500 further includes active, functional transistor cells TC in an active area 610, whereas an edge area 690 between the side surface 103 and the active area 610 is devoid of any functional transistor cells of the type present in the active area 610. Each active transistor cell TC includes body/anode zones 115 of the second conductivity type forming first pn junctions pn1 with the drift zone 120 as well as source zones 110 forming second pn junctions with the body/anode zones 115. The source zones 110 may be wells extending from the first surface 101 into the semiconductor body 100, for example into the body/anode zones 115.

A gate structure 150 includes a conductive gate electrode 155 which may include or consist of a heavily doped polycrystalline silicon layer or a metal-containing layer as well as a gate dielectric 151 separating the gate electrode 155 from the semiconductor body 100. The gate dielectric 151 capacitively couples the gate electrode 155 to channel portions of the body/anode zones 115.

In the illustrated embodiments and for the following description, the first conductivity type is the n-type and the second conductivity type is the p-type. Similar considerations as outlined below apply to embodiments with the first conductivity being the p-type and the second conductivity type being the n-type.

When a voltage applied to the gate electrode 150 exceeds a preset threshold voltage, electrons accumulate in the channel portions of the body/anode zones 115 directly adjoining the gate dielectric 151 and form inversion channels short-circuiting the first pn junctions pn1.

The gate structure 150 includes an idle portion 150a including an idle gate electrode 155a in the edge area 690. The idle gate electrode 155a and the gate electrode 155 are electrically and structurally connected to each other and may be portions of the same layered structure. A gate construction 330 may be connected to the gate electrode 155 via the idle gate electrode 155a.

The gate construction 330 may include at least one of a gate pad, a gate finger, and a gate runner electrically connected to the gate electrode 155, respectively. A gate pad may be a metal pad suitable as a landing pad for a bond wire or another chip-to-leadframe or chip-to-chip connection like a soldered clip. The gate pad may be arranged between a first load electrode 310 and the side surface 103 or in a center portion of the semiconductor body 100. A gate runner may be a metal line surrounding the active area 610. A gate finger may be a metal line separating the active areas 610 in separated cell fields. An interlayer dielectric 210 separates the gate construction 330 from the semiconductor body 100 and may insulate the gate electrode 155 from the first load electrode 310.

A conductive structure 157 structurally and electrically connects the idle gate electrode 155a with the gate construction 330 or with a gate contact structure 315g extending from the gate construction 330 into the interlayer dielectric 210. The conductive structure 157 can be a part of an integrated gate resistor or polycrystalline silicon diode or can be omitted below the gate construction 330. A portion of the interlayer dielectric 210 between the conductive structure 157 and the semiconductor body 100 forms a field dielectric 211. The field dielectric 211 has a transition Tr between a first vertical extension close to the gate dielectric thickness in a portion directly adjoining the idle gate electrode 155a and a second vertical extension, which is greater than the first vertical extension, in a section directly adjoining the gate construction 330 or the gate contact structure 315g. The transition Tr may be continuous or may include one or more steps.

The gate electrode 155, the idle gate electrode 155a and the conductive structure 157 may be homogeneous structures or may have a layered structure including one or more metal containing layers. According to an embodiment the gate electrode 155, the idle gate electrode 155a and the conductive structure 157 may include or consist of a heavily doped polycrystalline silicon layer.

The gate dielectric 151 may include or consist of a semiconductor oxide, for example thermally grown or deposited silicon oxide, semiconductor nitride, for example deposited or thermally grown silicon nitride or a semiconductor oxynitride, for example silicon oxynitride.

The first load electrode 310 may be, e.g., an anode electrode of an MCD, a source electrode of an IGFET or an emitter electrode of an IGBT. Contact structures 315 electrically connect the first load electrode 310 with the body/anode zones 115 and the source zones 110. The first load electrode 310 may be or may be electrically coupled or connected to a first load terminal L1, for example the anode terminal of an MCD, the emitter terminal of an IGBT or the source terminal of an IGFET.

A second load electrode 320, which directly adjoins the second surface 102 and the pedestal layer 130, may form or may be electrically connected to a second load terminal L2, which may be the cathode terminal of an MCD, the collector terminal of an IGBT or the drain terminal of an IGFET.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Ti, V, Ag, Au, Pt, W, and Pd as main constituent(s), e.g., a silicide, a nitride and/or an alloy.

The interlayer dielectric 210 may include one or more dielectric layers from silicon oxide, silicon nitride, silicon oxynitride, doped or undoped silicon glass, for example BSG (boron silicate glass), PSG (phosphorus silicate glass) or BPSG (boron phosphorus silicate glass), by way of example.

In the vertical projection of the transition Tr in the field dielectric 211, the semiconductor body 100 includes a non-depletable extension zone 170 of the second conductivity type. The non-depletable extension zone 170 is electrically connected to at least one of the body/anode zones 115 and may directly adjoin or overlap with an outermost of the body/anode zones 115, by way of example. A net dopant concentration in the non-depletable extension zone 170 is sufficiently high such that the non-depletable extension zone 170 is not completely depleted when the respective semiconductor device 500 is operated within its maximum blocking ratings.

According to an embodiment the net dopant concentration of the non-depletable extension zone 170 is such that when a maximum voltage is applied between the first and second load electrodes 310, 320 the non-depletable extension zone 170 is not depleted regardless of a gate voltage applied to the gate construction 330 provided that the applied gate voltage is within the maximum ratings of the semiconductor device 500 for the gate voltage.

When the semiconductor device 500 is operated with the forward-biased first pn junction pn1 between the body/anode zones 115 and the drift zone 120, the body/anode zones 115 inject holes and the pedestal layer 130 injects electrons into the drift zone 120. The injected charge carriers form a charge carrier plasma in both the active area 610 and the edge area 690. When the semiconductor device 500 commutates after reverse-biasing the first pn junction pn1 the second load electrode 320 drains off electrons and the first electrode 310 drains off holes. Holes flowing from the edge area 690 to the first load electrode 310 travel to the outermost contact structure 315 that electrically connects the first load electrode 310 with the outermost source and body/anode zones 110, 115 of the active area 610. The hole current flow results in high hole concentrations and high hole current densities in a portion of the edge area 690 in the vertical projection of the conductive structure 157.

On the other hand in areas of the semiconductor body 100 below the transition Tr the electric surface field strength is high resulting in increased charge carrier multiplication. As a result of the surface field strength and the hole current flow, the dynamic breakdown voltage is locally reduced and the field dielectric 211 can be irreversibly damaged.

The non-depletable extension zone 170 effects that a surface electric field is only formed beyond a minimum hole current density which compensates for the charge of the stationary p-type dopants in the non-depletable extension zone 170. Increasing the p-type dopant concentration reduces the surface electric field strength such that the dynamic breakdown voltage may be locally increased. The field dielectric 211 is more reliable and in a half-bridge circuit the semiconductor device 500 can sustain steeper and faster gate signals of the commutating switch of the half-bridge circuit.

In case of a silicon semiconductor body 100, the effective dose of p-type dopants in the non-depletable extension zone is greater than $2.5\mathrm{E}12\ \mathrm{cm}^{-2}$, for example at least $1\mathrm{E}13\ \mathrm{cm}^{-2}$. According to an embodiment the p-type dopant dose in the non-depletable extension zone 170 is greater than $2\mathrm{E}13\ \mathrm{cm}^{-2}$. The non-depletable extension zone 170 directly adjoins or overlaps or is electrically connected with the p-type body/anode zone 115 of the outermost transistor cell TC of the active area 610 with reference to the edge area 690.

Within the non-depletable extension zone 170 the impurity concentration is constant or decreases by not more than 50% between a starting point of the transition Tr, where a vertical extension of the transition Tr starts to increase from the first vertical extension, and a reference point at a distance of at least 1 µm to the starting point. According to an embodiment, the impurity concentration is constant or deviates by not more than 50% over a distance of at least 3 µm, for example at least 8 µm, to the starting point in the direction along which the transition Tr increases.

A vertical extension of the non-depletable extension zone 170 perpendicular to the first surface 101 may exceed a vertical extension of the body/anode zones 115 of the transistor cells TC.

The semiconductor device 500 of FIG. 1B differs from the semiconductor device 500 of FIG. 1A in that a dedicated contact structure 315a electrically connects the first load electrode 310 directly with the non-depletable extension zone 170 in the edge area 690. The dedicated contact structure 315a is spatially separated from any source zone 110. The transition Tr of the field dielectric 211 includes a step that corresponds to a vertical step in the conductive structure 157.

The semiconductor device 500 of FIG. 1C is a superjunction IGFET based on the semiconductor device 500 of FIG. 1A. The first load electrode 310 is effective as source electrode electrically connected to a source terminal S. The second load terminal 320 is effective as drain electrode D. An edge termination construction 195 formed in a portion of the edge area 690 directly adjoining the side surface 103 may include a drain electrode construction 325 on a front side of the semiconductor body 100 opposite to the second load electrode 320.

The drift zone 120 may include a superjunction structure 180 including first zones 181 of the first conductivity type and second zones 182 of the second conductivity type. At least the second zones 182 or at least the first zones 181 may be columnar structures formed by implantation e.g. in successive epitaxy and implantation steps. According to other embodiments the second zones 182 are formed by depositing material containing p-type dopants into trenches temporally formed between the first zones 181 or by introducing dopants through sidewalls of trenches temporally extending from the first surface 101 into the drift zone 120.

The lateral cross-sectional areas of the second zones 182 may be circles, ovals, ellipses or rectangles with or without rounded corners and the first zones 181 may form a grid with the second zones 182 arranged in the meshes. According to another embodiment lateral cross-sectional areas of the first zones 181 are circles, ellipses, ovals or rectangles with or without rounded corners and the second zones 182 form a grid with the first zones 181 arranged in the meshes. In accordance with a further embodiment the first and second zones 181, 182 form a regular stripe pattern, wherein the stripes may extend through a significant portion of the active area 610 or may cross the active area 610.

The dopant concentrations in the first and second zones 181, 182 may be adjusted to each other such that the portion of the drift zone 120 including the superjunction structure 180 can be completely depleted in a reverse blocking mode of the semiconductor device 500.

According to an embodiment, the first and second zones 181, 182 may be formed exclusively within the active area 610, whereas the edge area 690 or a gate area in the vertical projection of gate constructions such as gate pads, gate fingers and/or gate runners are devoid of any superjunction structure, for example devoid of any first and second zones 181, 182. For example, the semiconductor device 500 may include a superjunction structure with first and second zones 181, 182 in the active area 610 and only intrinsic or weakly doped regions of the first conductivity type having a lower net impurity concentration than the first zones 181 in the edge area 610 and in the vertical projection of gate areas. Alternatively first zones 181 and second zones 182 may overlap in the edge area 610 and/or in the vertical projection of gate areas to form regions of a low net dopant concentration in the concerned areas.

According to the illustrated embodiment, a superjunction structure with first and second zones 181, 182 is formed in both the active area 610 and the edge area 690. A depletable extension zone 175 may directly adjoin to or overlap with the non-depletable extension zone 170 and one, some or all of the second zones 182 in the edge area 690 along the illustrated cross-sectional line.

The p-type dopant dose in the depletable extension zone 175 is sufficiently low such that the depletable extension zone 175 is completely depleted in the blocking mode of the semiconductor device 500. For example, the implanted p-type dopant dose in the depletable extension zone 175 may result from an implant dose of at most $3.5\mathrm{E}12\ \mathrm{cm}^{-2}$ resulting, when considering segregation effects, in a remnant effective p-type dopant dose of at most $2\mathrm{E}12\ \mathrm{cm}^{-2}$ in silicon.

A vertical extension of the non-depletable extension zone 170 perpendicular to the first surface 101 may exceed a vertical extension of the body/anode zones 115 of the transistor cells TC. For example, in the reverse biased mode an edge of a depletion zone in the semiconductor body 100 oriented to the first surface 101 may have a greater distance to the first surface 101 in the non-depletable extension zone 170 than in p-type structures including the body/anode zones 115 and the second zones 182.

When the semiconductor device 500 commutates the first and second zones 181, 182 are depleted, wherein in the second zones 182 holes travel along the vertical direction and reach the first surface 101. In the edge area 690, a resulting hole current at the first surface 101 into the direction of the next contact structure 315 adds to a hole current resulting from the holes injected into the drift zone 120 in the forward-biased mode of the body pn junction pn1. As a result, in superjunction devices the effect discussed above is more significant since a greater portion of the holes is first guided to the first surface 101 and then guided along the first surface into the direction of the first contact 315. The effect may be even more pronounced since in the active area 610 the second zones 182 accelerate the hole discharge and, when finally the hole current in the active area 610 pinches off, the edge area 690 still discharges holes and due to leakage inductance carries further increased hole current densities.

The depletable extension zone 175 reduces the resistance effective for the total hole current flow from at least one or some of the second zones 182 of the edge area 690 to a contact structure 315 electrically connecting the first load electrode 310 with the extension zones 170, 175 and may reduce the switching losses.

In addition, the comparatively high hole current density significantly reduces the dynamic breakdown voltage of the field dielectric 211. Instead, the non-depletable extension zone 170 locally decreases the surface electric field strength without significantly adversely affecting the lateral voltage blocking capability despite that the hole current densities are increased by approximately one order of magnitude.

The semiconductor device 500 of FIG. 1D differs from the superjunction IGFET of FIG. 1C in that the depletable extension zone 175 is connected to all second zones 182 in the edge area 690 between the non-depletable extension zone 170 and the side surface 103 and in that a spacer zone 173 of the first conductivity type separates the depletable extension zone 175 from the first surface 101. The spacer zone 173 reduces the effect of holes flowing into direction of the active area 610 during commutation on the field dielectric 211. The surface electric field is more homogenous, the integrated ionization charge along the hole current flow is reduced and the dynamic breakdown voltage is further increased.

The semiconductor device 500 of FIG. 1E is an IGFET based on the semiconductor device 500 of FIG. 1A. A field stop layer 128 having a dopant concentration at least twice as high as in the drift zone 120 separates the drift zone 120 from the pedestal layer 130. In another embodiment a buffer layer with a dopant concentration that is lower than in the first zones 181 is formed between the pedestal layer 130 and the second zones 182.

The transistor cells TC are vertical transistor cells TC with the gate structures 150 including buried gate electrodes 155 extending from the first surface 101 into the semiconductor body 100. A dielectric structure 205 may separate the first load electrode 310 from the buried gate electrodes 155.

Other embodiments may refer to IGBTs on the basis of the IGFETs of FIGS. 1C to 1E with the pedestal layer 130 having the p-type or including p-type zones. For IGBTs, the first load electrode 310 is effective as an emitter electrode forming or electrically connected or coupled to an emitter terminal. The second load electrode 320 is effective as collector electrode and forms or is electrically connected to a collector terminal.

The semiconductor device 500 of FIG. 1F is an MCD that may include a barrier layer 121 between the body/anode zones 115 and the drift zone 120. The pedestal layer 130 may include first zones 131 of the first conductivity type and second zones 132 of the second conductivity type extending between the drift zone 120 and the second surface 102, respectively. The transistor cells TC are switched off in the normal forward-biased state of the MCD. Before commutation, a potential applied to the gate electrode 155 generates inversion layers from the source zones 110 to the drift zone 120 through the body/anode zones 115. The inversion layers short-circuit the first pn junction pn1 between the body/anode zones 115 and the drift zone 120 and reduce or suppress hole injection from the body/anode zones 115 into the drift zone 120. The carrier plasma in the drift zone 120 is reduced and the recovery charge can be decreased. The barrier layer 121 reduces the lateral voltage drop along the first pn junction pn1 to avoid injection between the gate structures 150 in a distance to the inversion layers.

According to an embodiment referring to IGFETs including MGD (MOS gated diode) cells the semiconductor device 500 may include IGFET cells and MGD cells with gate electrodes electrically connected to the first load electrode 310. In the reverse conducting mode of the semiconductor device 500 the current flow between the first and second load electrodes 310, 320 results in that the body/anode zones 115 are negatively biased with respect to the first load electrode 310 and the gate electrodes of the MGDs and an inversion layer may be formed in the body/anode zones 115. If in the reverse mode the total current through the semiconductor device 500 is above an average current flow density threshold, it is typically dominated by a unipolar current flow reducing the electric losses compared to the case of a total current flow across the first pn junctions pn1.

FIGS. 2A to 2G refer to lateral cross-sections of semiconductor devices 500 for illustrating embodiments of the lateral extension of the non-depletable extension zones 170 of any of the semiconductor devices 500 of FIGS. 1A to 1E.

An edge area 690 devoid of functional transistor cells separates an active area 610, which includes the functional transistor cells, from the side surface 103 of a semiconductor body 100. The edge area 690 includes gate area 695 in the vertical projection of a gate construction 330. In the illustrated embodiment the gate area 695 is assigned to a gate construction 330 including a single gate pad. According to other embodiments, the gate construction 330 may include more than one gate pad, a gate runner, and/or one or more gate fingers and the gate area 695 may include further portions in the vertical projection of gate fingers and/or gate runners that form sections of electric connections between gate electrodes and a gate pad in a metallization plane. Gate pad and gate area 695 may be arranged in a corner or along one of the lateral sides of the semiconductor body 100. A gate runner may surround the active area 610. A gate finger may separate the active areas 610 in separate cell fields.

Figure 2A:
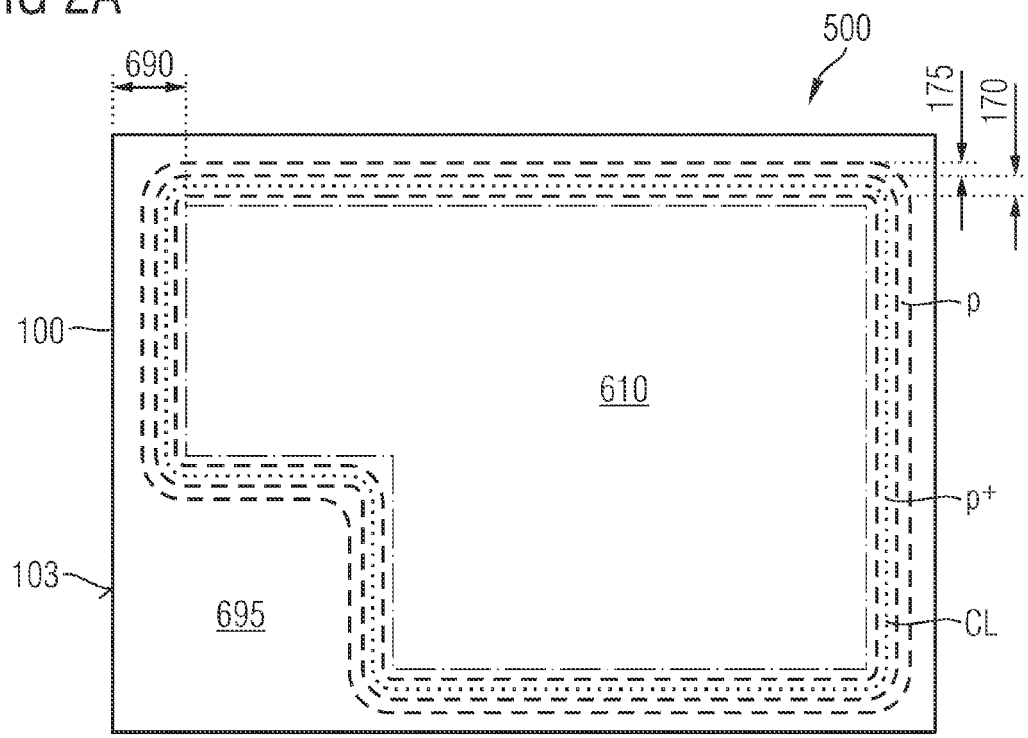
FIG. 2A is a schematic lateral cross-sectional view of a semiconductor device in accordance with an embodiment with a non-depletable extension zone surrounding an active area along a circumferential line at a constant dopant concentration.

FIG. 2A shows a non-depletable extension zone 170 completely surrounding the active area 610 along a circumferential line CL sparing the gate area 695. Along the circumferential line CL, a net dopant concentration of the non-depletable extension zone 170 is constant. A depletable extension zone 175 may directly adjoin or overlap with the non-depletable extension zone 170 in the edge area 690 at a side oriented to the side surface 103.

Figure 2B:
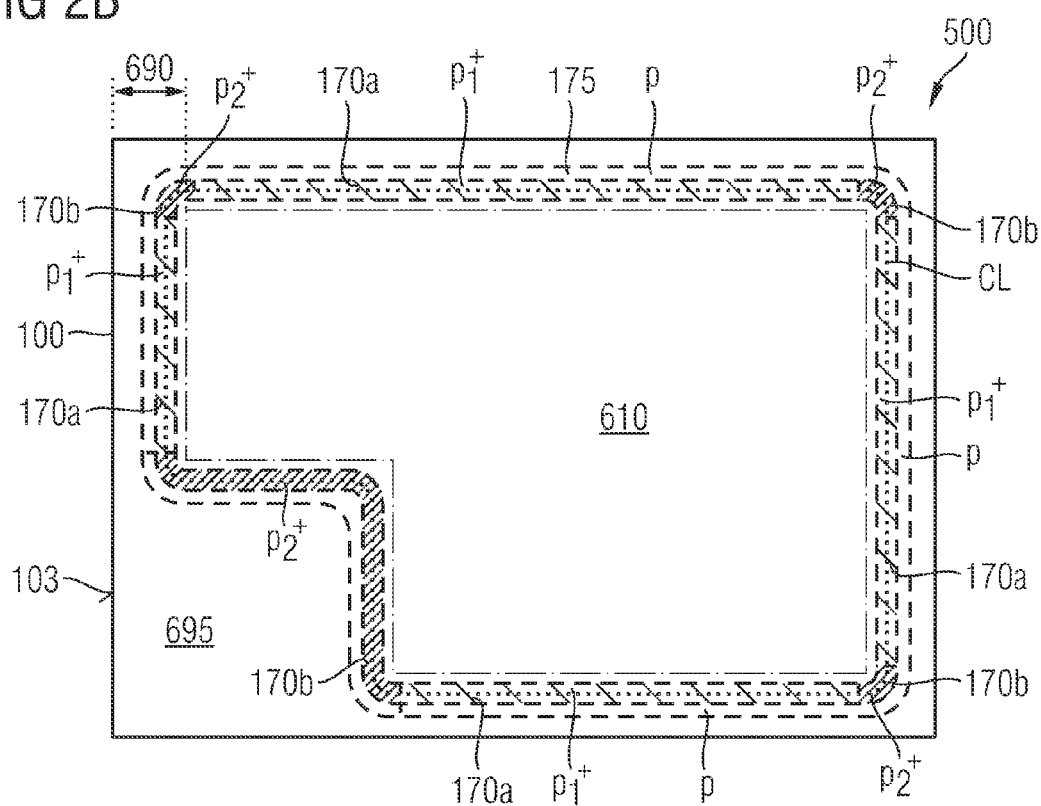
FIG. 2B is a schematic lateral cross-sectional view of a semiconductor device in accordance with an embodiment providing a non-depletable extension zone that surrounds an active area and that includes sections of enhanced dopant concentration.

FIG. 2B refers to an embodiment with a first, along the circumferential line CL approximately constant net dopant concentration p1+ in first sections 170a of the non-depletable extension zone and an enhanced second net dopant concentration p2+, which is higher, e.g. at least twice as high as the first net dopant concentration p1+, in second sections 170b. The second sections 170b may be laterally curved sections close to the corners of the semiconductor body 100 and/or sections between the active area 610 and the gate area 695. The first sections 170a may be straight sections connecting the second sections 170b.

The second sections 170b may be formed by implanting the concerned dopants at a locally increased implant dose or by performing a first implant with uniform implant dose along the circumferential line CL and a second implant which is selectively effective in the second sections.

The higher dopant concentration in the second sections 170b may compensate for an increased hole current close to the corners and to the gate area 695 and resulting from increased hole current density in wider portions of the semiconductor body 100 without source and body contacts, e.g. in the gate area 695 and close to the corners, where more holes are allocated per length unit of the extension zones 170, 175 along the circumferential line CL.

The dopant concentration profiles of the non-depletable extension zones 170 along the circumferential line CL may include further sections with a dopant concentration between the first and the second dopant concentrations. The first sections 170a of the non-depletable extension zone may contain a dopant dose of at least $2.5E12$ cm$^{-2}$, for example at least $1E13$ cm$^{-2}$ or greater than $2E13$ cm$^{-2}$. The second sections 170b may contain a dopant dose which is at least twice as high as the first dopant dose, for example at least four times as high as the first dopant dose.

In the semiconductor device 500 in FIG. 2C the non-depletable extension zone 170 includes an enlarged portion 170x formed in the vertical projection of a gate pad in the gate area 695. The enlarged portion 170x may extend over the complete gate area 695 and may overlap the complete vertical projection of a gate construction including at least a gate pad. A further portion of the non-depletable extension zone 170 surrounds the active area 610 as described with reference to FIG. 2A.

Figure 2D:
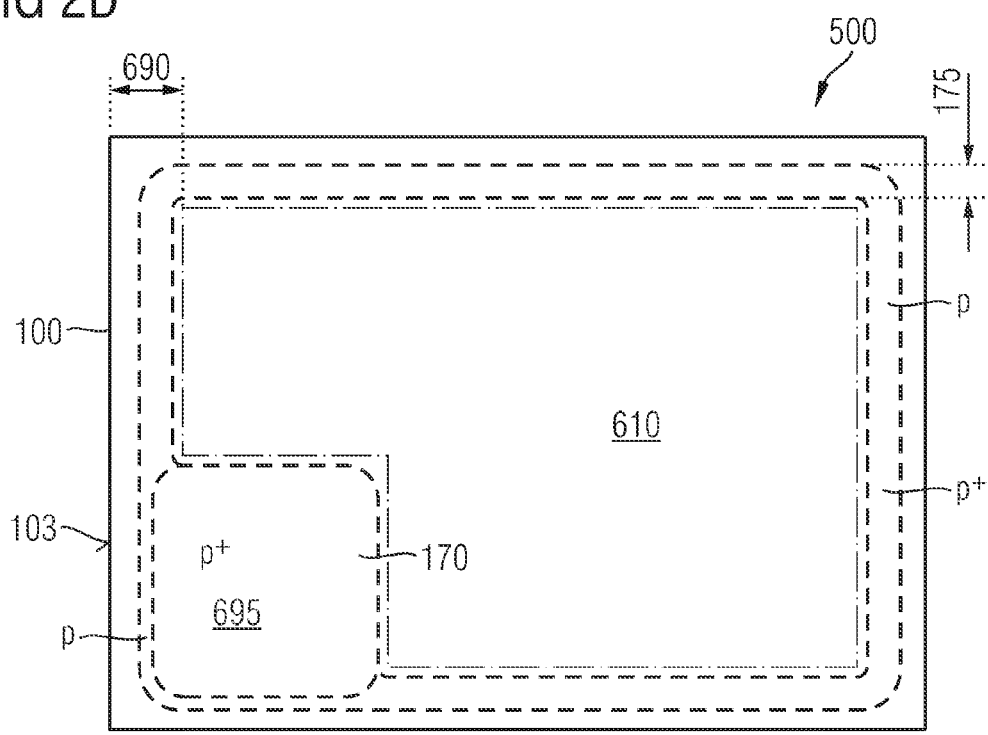
FIG. 2D is a schematic lateral cross-sectional view of a semiconductor device in accordance with an embodiment with a non-depletable extension zone exclusively formed in the vertical projection of a gate construction.

In FIG. 2D the non-depletable extension zone 170 is exclusively formed in the vertical projection of a gate pad in the gate area 695. The non-depletable extension zone 170 may include further sections in further sections of the gate area 695 assigned to gate fingers and/or gate runners.

Figure 2E:
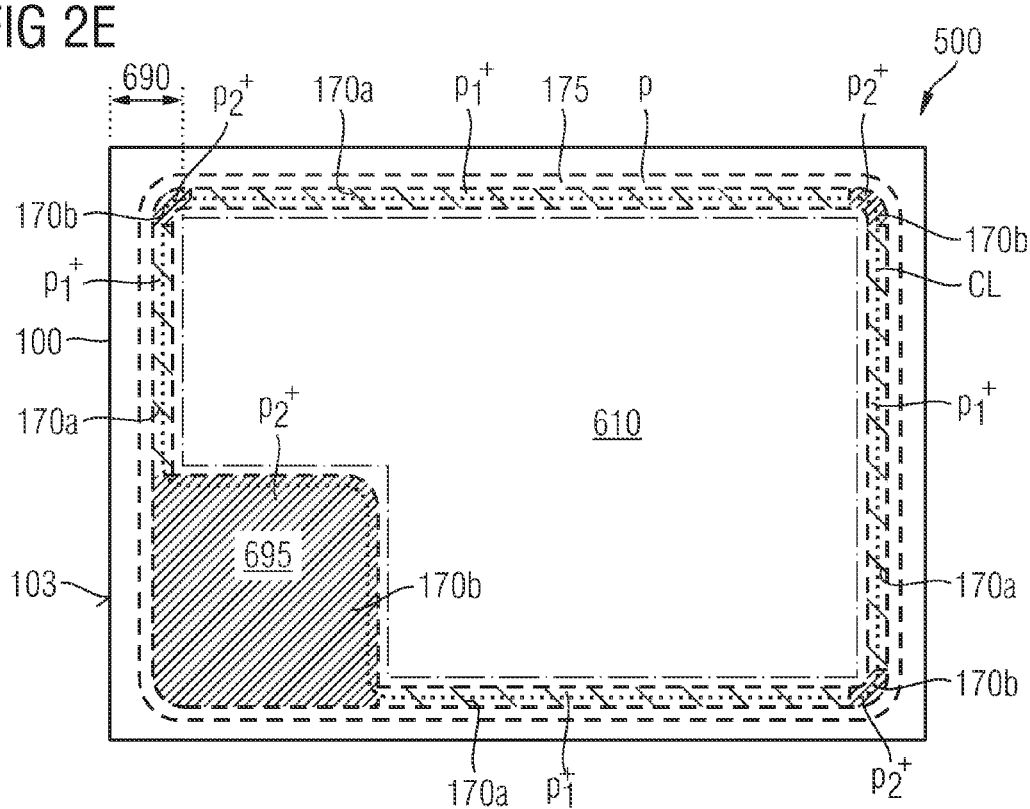
FIG. 2E is a schematic lateral cross-sectional view of a semiconductor device in accordance with an embodiment with a non-depletable extension zone including a section of enhanced dopant concentration in the vertical projection of a gate construction.

The semiconductor device 500 of FIG. 2E differs from the one in FIG. 2B in that the non-depletable extension zone 170 includes a section of enhanced dopant concentration 170b that extends over the complete or at least a main portion of the gate area 695 and overlaps with at least a main portion of the vertical projection of a gate pad. The non-depletable extension zone 170 may include further sections in further sections of the gate area 695 assigned to gate fingers and/or gate runners.

Figure 2F:
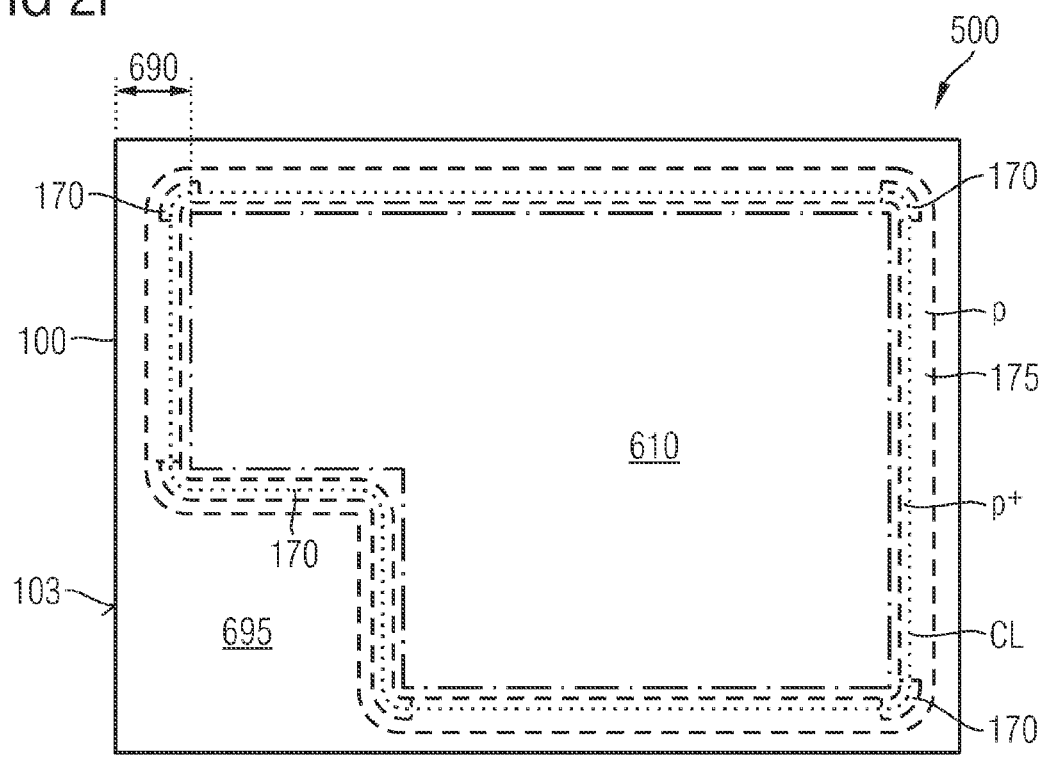
FIG. 2F is a schematic lateral cross-sectional view of a semiconductor device in accordance with an embodiment providing a segmented non-depletable extension zone.

FIG. 2F refers to an embodiment with the non-depletable extension zone 170 including isolated segments arranged along the circumferential line CL. The segments may be curved sections in the corners of the semiconductor body 100 and/or sections between the active area 610 and the gate area 695.

Figure 2G:
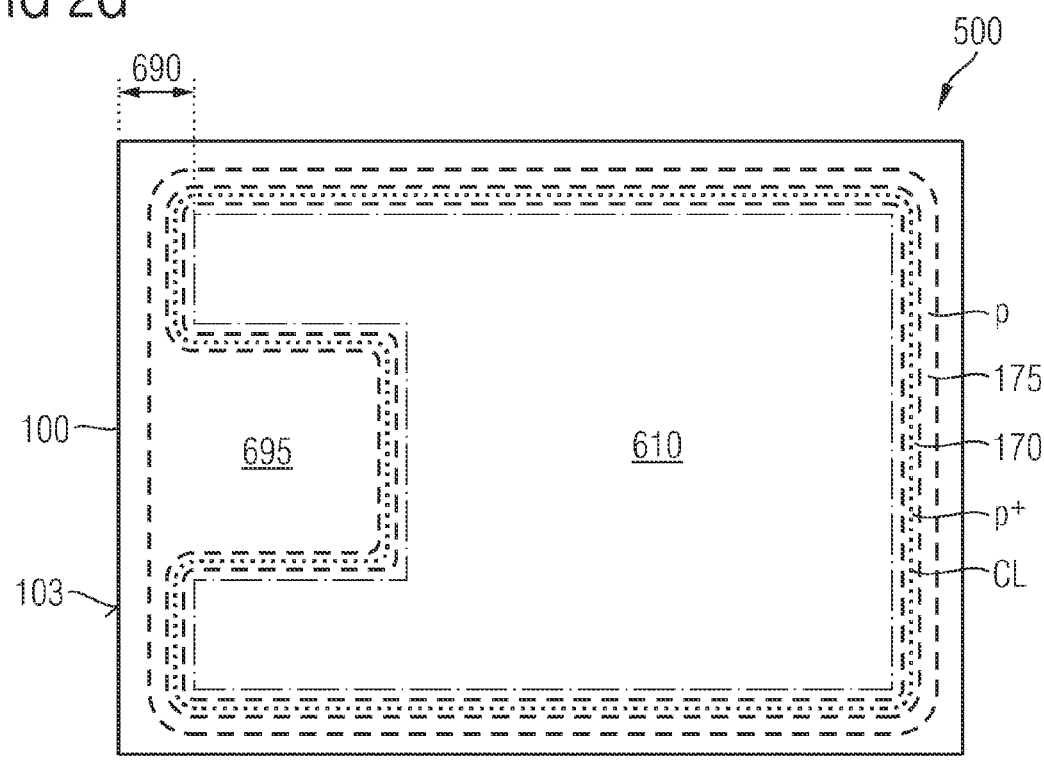
FIG. 2G is a schematic lateral cross-sectional view of a semiconductor device in accordance with an embodiment with a portion of a non-depletable extension zone formed in the vertical projection of a portion of a gate construction.

FIG. 2G refers to a layout with the gate area 695 arranged along one of the lateral sides and symmetric with respect to a lateral center axis of the semiconductor body 100. Sections of the depletable and not-depletable extension zones 175, 170 may completely span the gate area 695. In a further embodiment, the gate pad may be located in the middle of the active area 610.

Figure 3:
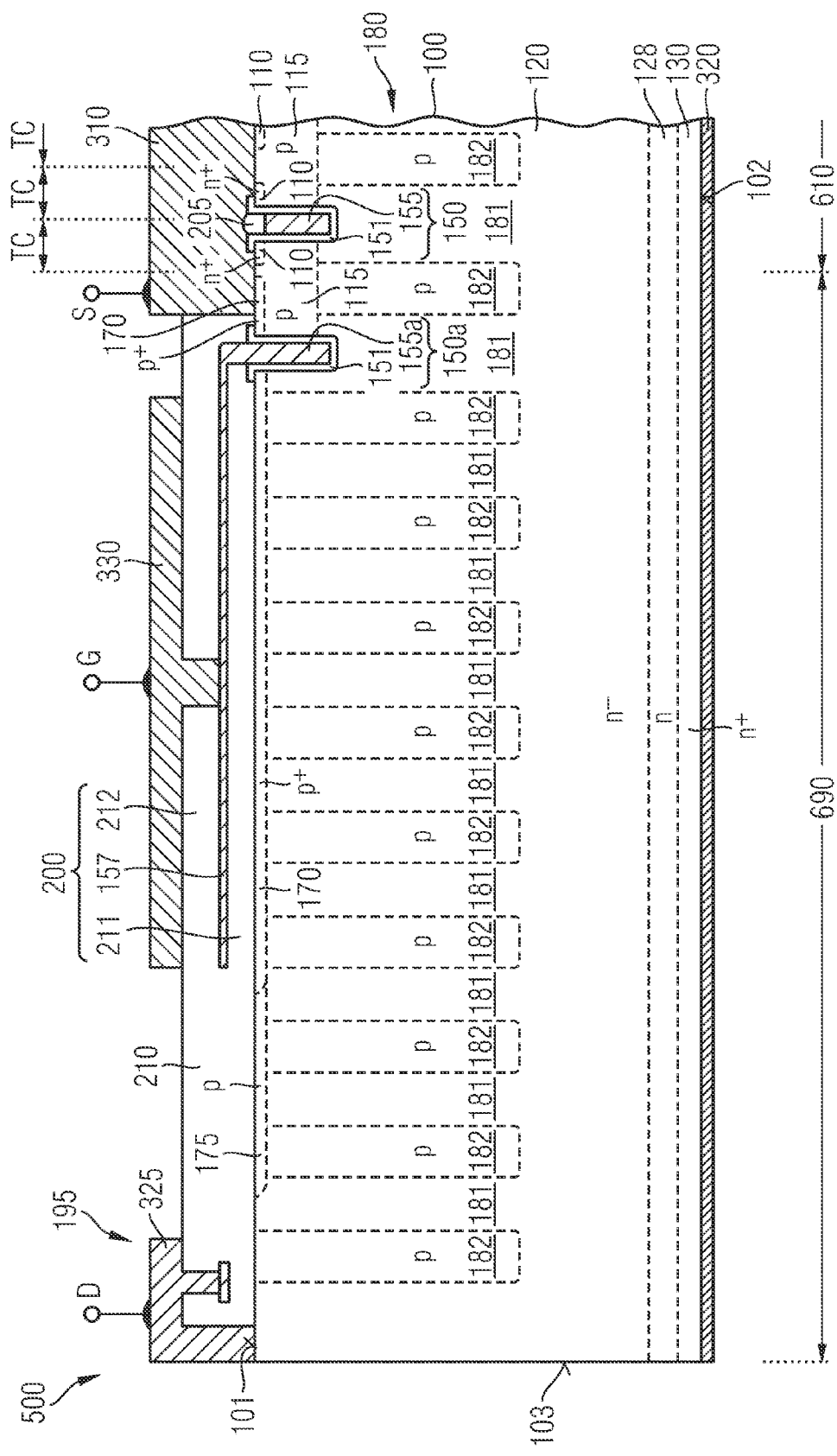
FIG. 3 is a schematic cross-sectional view of a portion of a semiconductor device in accordance with another embodiment with a non-depletable extension zone in the vertical projection of a portion of a gate construction.

FIG. 3 refers to semiconductor devices 500 with a non-depletable extension zone 170 formed at least in a portion of the vertical projection of a gate construction 330. The non-depletable extension zone 170 may extend over at least 40% of the vertical projection of the gate construction 330, for example over at least 80%. According to an embodiment the non-depletable extension zone 170 extends over the whole vertical projection of the gate construction 330. The configuration of the gate construction 330, the conductive structure 157 electrically connecting the gate construction 330 with idle gate electrodes 155a as well as the non-depletable extension zone 170 as shown in FIG. 3 can be combined with any of the semiconductor devices 500 described with reference to FIGS. 1A to 1F. An interlayer dielectric structure 200 adjoins a first surface 101 of the semiconductor body 100. In the edge area 690 the interlayer dielectric structure 200 separates a gate construction 330 from the semiconductor body 100. The interlayer dielectric structure 200 may include a conductive structure 157, wherein a field dielectric 211 separates the conductive structure 157 from the semiconductor body 100 and a capping dielectric 212 separates the conductive structure 157 from the gate construction 330.

In the vertical projection of at least a portion of the gate construction 330 in the semiconductor body 100 is a non-depletable extension zone 170 of a conductivity type of body/anode zones 115 of the transistor cells TC. The gate construction 330 may be a gate pad suitable as a landing pad for a bond wire or another chip-to-leadframe or chip-to-chip connection like a soldered clip. The gate pad can be in direct connection with the conductive structure 157. The conductive structure 157 can be a part of an integrated gate resistor or polycrystalline silicon diode or can be omitted below the gate pad. For further details reference is made to the description of FIGS. 1A to 2G.

During commutation, the non-depletable extension zones 170 reduce a resistance effective for a hole current flow between the edge area 690 and the outermost contact of the first load electrode 310 oriented to the edge area 690. Compared to depletable extension zones, which are fully depleted in case of the hole current flow and, consequently, have a comparatively high ohmic resistance, the non-depletable extension zone 170 is not fully depleted and, consequently, improves the depletion process of holes and reduces dynamic switching losses. While without non-depletable extension zones 170 a capacity of the gate construction 330 adds to the gate-to-drain capacity $C_{gd}$ after depletion of the second zones 182, the non-depletable extension zone 170 shields the gate construction 330 such that the gate-to-drain capacity $C_{gd}$ is not increased or is increased to a lower degree resulting in reduced switching losses.

The diagram of FIG. 4 schematically shows the switching losses Eoff as a function of the load current Isat. Comparative examples 791 without non-depletable extension zones show higher switching losses as comparable devices 792 including non-depletable extension zones. The non-depletable extension zones reduce the commutation losses. Since in resonant applications energy capacitively stored in the semiconductor device 500 is recovered, losses resulting from a gate construction 330 may contribute to a third of the overall commutation losses.

FIGS. 5A to 5D refer to electronic circuits 700 including one or more half-bridge circuits 710 based on two semiconductor switching devices 711, 712 with load current paths connected in series between Vdd and Gnd. The semiconductor switching devices 711, 712 may be IGFETs or IGBTs. At least one of the semiconductor switching devices 711, 712 may be or may include one of the semiconductor devices 500 of the previous figures. The half-bridge circuit 710 or the complete electronic circuit 700 may be integrated in a power module.

The electronic circuit 700 may include a gate driver circuit 720 generating and driving a first gate signal at a first driver terminal Gout1 and a second gate signal at a second driver terminal Gout2. The first and second driver terminals Gout1, Gout2 are electrically coupled or connected to gate terminals G of the semiconductor switching devices 711, 712. The gate driver circuit 720 controls the gate signals such that during regular switching cycles the first and second switching devices 711, 712 are alternatingly in the on state. During desaturation cycles, the gate driver circuit 720 may apply desaturation pulses before switching one of the switching devices 711, 712 into the on state.

Figure 5A:
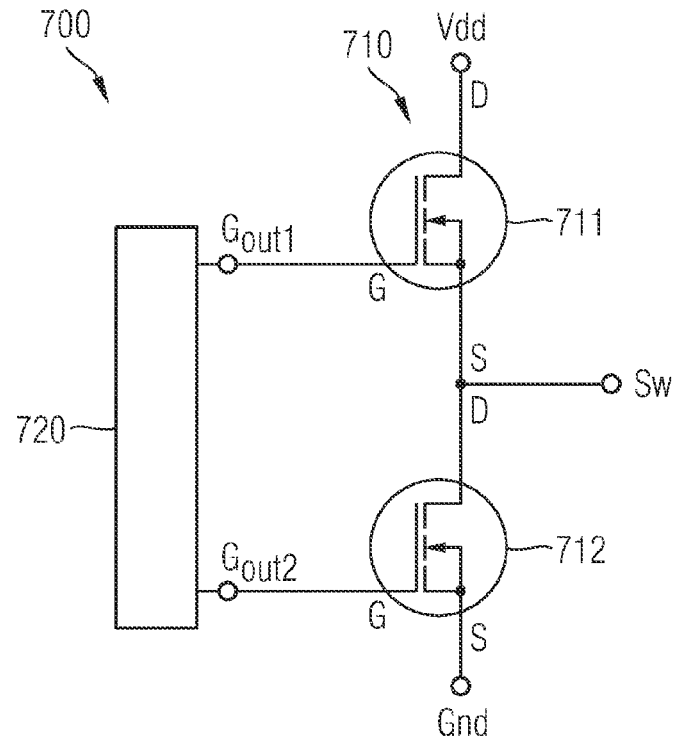
FIG. 5A is a schematic circuit diagram of a half-bridge circuit according to an embodiment with two n-type IGFETs.

In FIG. 5A the switching devices 711, 712 are n-IGFETs with a source terminal S of the first switching device 711 and a drain terminal D of the second switching device 712 electrically connected to a switching terminal Sw.

Figure 5B:
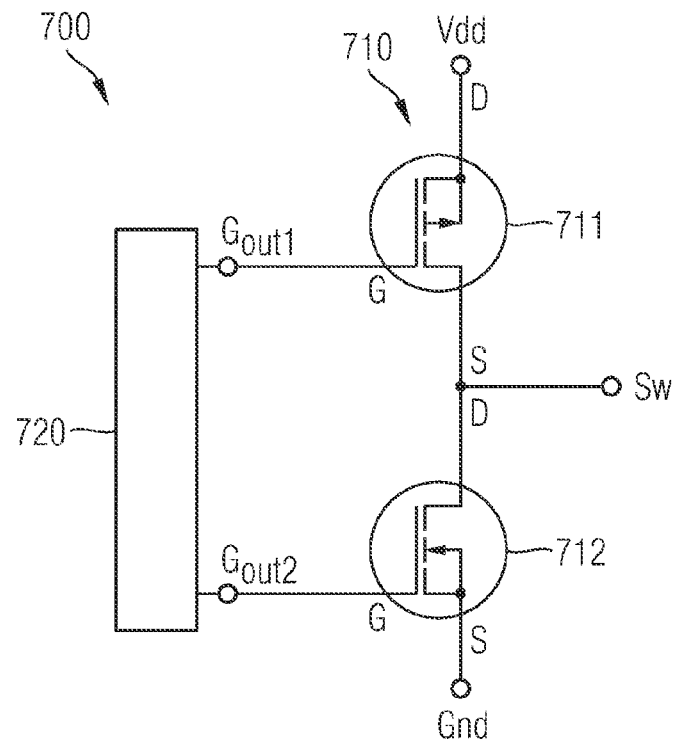
FIG. 5B is a schematic circuit diagram of a half-bridge circuit according to an embodiment with a p-type and an n-type IGFET.

In FIG. 5B the first switching device 711, 712 is a p-IGFET and the second switching device 712 is an n-IGFET.

Figure 5C:
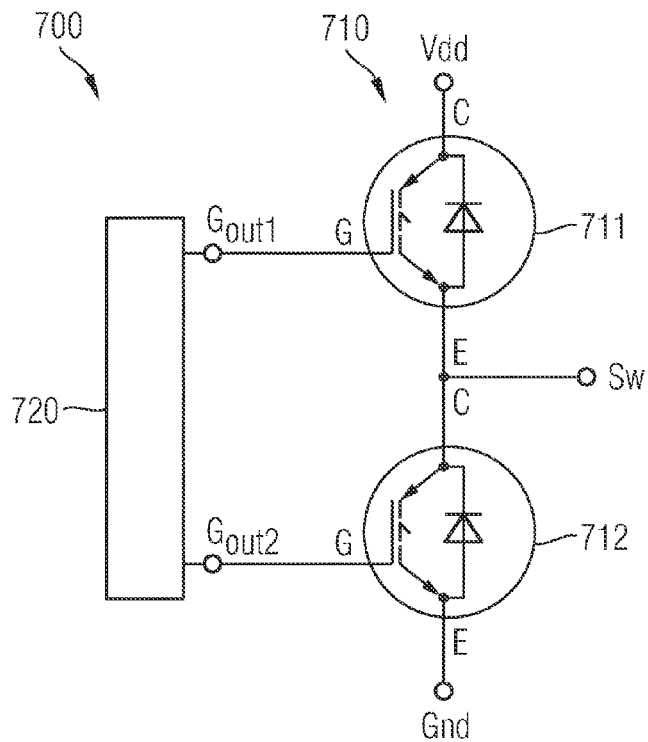
FIG. 5C is a schematic circuit diagram of a half-bridge circuit according to an embodiment with IGBTs.

In FIG. 5C the switching devices 711, 712 are n-channel IGBTs with an emitter terminal E of the first switching device 711 and a collector terminal C of the second switching device 712 electrically connected to a switching terminal Sw.

Figure 5D:
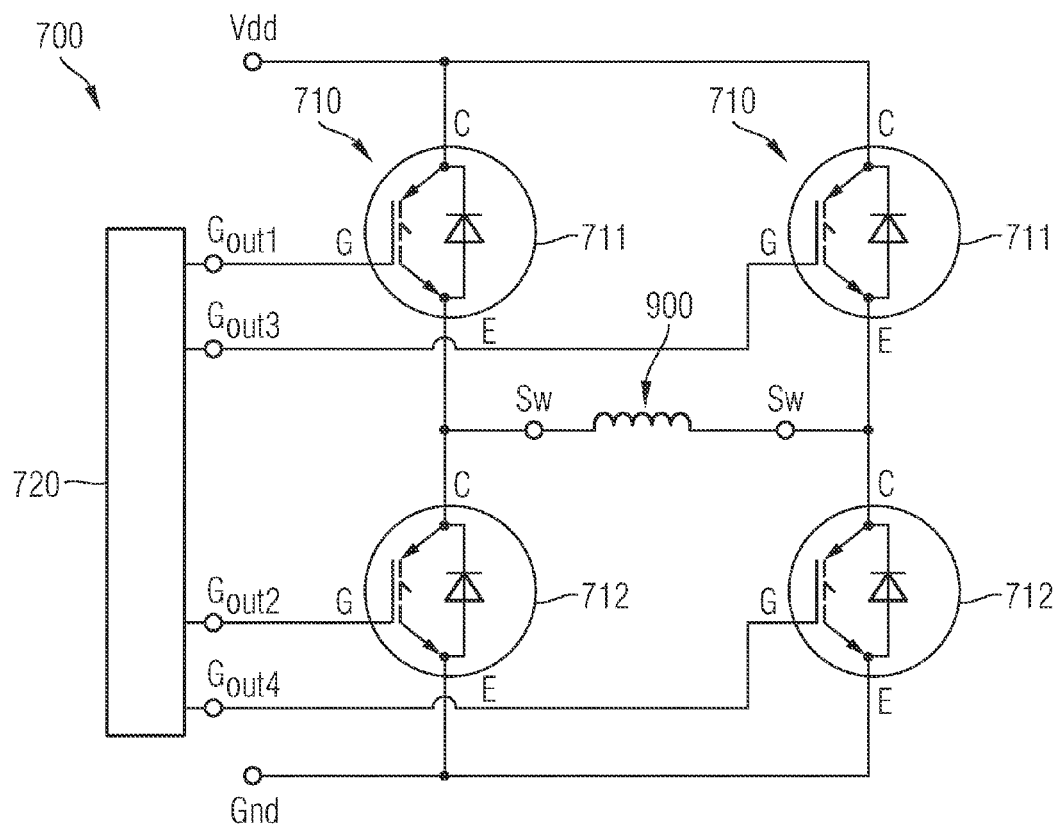
FIG. 5D is a schematic circuit diagram of a full-bridge circuit according to a further embodiment.

FIG. 5D shows an electronic circuit 700 with two half-bridges 710 whose load paths are connected in parallel and operated in a full-bridge configuration. A load 900, e.g. an inductive load, may be connected to the switching terminals Sw of the two half-bridges 710. The load 900 may be a motor winding, an inductive cooking plate or a transformer winding in a switched-mode power supply, by way of example. According to another embodiment the electronic circuit 700 may include three half-bridges 710 for driving a motor with three windings wherein each winding is connected between a star node of the motor windings and one of the switching terminals Sw of the half bridges 710.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body comprising transistor cells arranged in an active area and absent in an edge area between the active area and a side surface of the semiconductor body;
a field dielectric adjoining a first surface of the semiconductor body and separating, in the edge area, a conductive structure connected to gate electrodes of the transistor cells from the semiconductor body, the field dielectric comprising a transition from a first to a second, greater vertical extension; and
a non-depletable extension zone of a conductivity type of body/anode zones of the transistor cells and electrically connected to at least one of the body/anode zones, wherein the transition is in the vertical projection of the non-depletable extension zone,
wherein the non-depletable extension zone surrounds the active area and comprises straight first sections with a constant first net dopant concentration and laterally curved second sections, wherein the first sections connect the second sections and a second net dopant concentration of the second sections is at least twice as high as the first net dopant concentration.

2. The semiconductor device of claim 1, wherein the non-depletable extension zone is electrically connected to a metallic load electrode.

3. The semiconductor device of claim 1, wherein the non-depletable extension zone contains an effective dopant dose greater than $2.5E12$ cm$^{-2}$.

4. The semiconductor device of claim 1, further comprising:
a depletable extension zone of the conductivity type of the body/anode zones, directly adjoining the non-depletable extension zone, and arranged between the non-depletable extension zone and the side surface.

5. The semiconductor device of claim 4, wherein the depletable extension zone contains an effective dopant dose of at most $2.0E12$ cm$^{-2}$.

6. The semiconductor device of claim 4, further comprising:
a spacer zone between the first surface and the depletable extension zone and forming a pn junction with the depletable extension zone.

7. The semiconductor device of claim 1, wherein the conductive structure is a section of an electric connection between a gate construction and gate electrodes of the transistor cells.

8. The semiconductor device of claim 1, wherein the non-depletable extension zone directly adjoins a body/anode zone of at least one of the transistor cells.

9. The semiconductor device of claim 1, wherein a vertical extension of the non-depletable extension zone perpendicular to the first surface exceeds a vertical extension of the body/anode zones of the transistor cells.

10. The semiconductor device of claim 1, further comprising:
first zones of a first conductivity type opposite to a second conductivity type given by the conductivity type of the body/anode zones; and
second zones of the second conductivity type, the first and second zones alternately arranged in the semiconductor body in the active area and the edge area, wherein in the active area the second zones directly adjoin to the body/anode zones and the first zones form pn junctions with the body/anode zones.

11. The semiconductor device of claim 1, wherein an impurity concentration in the non-depletable extension zone does not decrease by more than 50% between a starting point of the transition, where a vertical extension of the transition starts to increase from the first vertical extension, and a reference point at a distance of at least 1 µm to the starting point.

12. A half-bridge circuit, comprising:
a semiconductor body comprising transistor cells arranged in an active area and absent in an edge area between the active area and a side surface of the semiconductor body;
a field dielectric adjoining a first surface of the semiconductor body and separating, in the edge area, a conductive structure connected to gate electrodes of the transistor cells from the semiconductor body, the field dielectric comprising a transition from a first to a second, greater vertical extension; and a non-depletable extension zone of a conductivity type of body/anode zones of the transistor cells and electrically connected to at least one of the body/anode zones, wherein the transition is in the vertical projection of the non-depletable extension zone, wherein the non-depletable extension zone surrounds the active area and comprises straight first sections with a constant first net dopant concentration and laterally curved second sections, wherein the first sections connect the second sections and a second net dopant concentration of the second sections is at least twice as high as the first net dopant concentration.

13. A semiconductor device, comprising:

a semiconductor body comprising transistor cells arranged in an active area and absent in an edge area between the active area and a side surface of the semiconductor body, wherein the edge area comprises a gate area in a vertical projection of at least one metal gate pad in a corner or along a lateral side of the semiconductor body;

an interlayer dielectric structure adjoining a first surface of the semiconductor body and separating, in the gate area, a gate construction from the semiconductor body, wherein the gate construction comprises the metal pad and the gate construction is electrically connected to a conductive structure that is of polycrystalline silicon electrically connected to gate electrodes of the transistor cells; and a non-depletable extension zone of a conductivity type of body/anode zones of the transistor cells in the complete vertical projection of the gate construction in the semiconductor body and electrically connected to one of the body/anode zones, wherein the non-depletable connection extension zone comprises first sections between the active area and the side surface and second sections between the active area and the gate area and wherein a second net dopant concentration in the second sections is at least twice as high as a first net dopant concentration in the first sections.

14. The semiconductor device of claim 13, wherein the non-depletable extension zone extends over at least 40% of a vertical projection of the gate construction.

15. The semiconductor device of claim 13, wherein the non-depletable extension zone is electrically connected to a load electrode.

16. The semiconductor device of claim 13, wherein the non-depletable extension zone contains an effective dopant dose greater than $2.5E12$ cm$^{-2}$.

17. The semiconductor device of claim 13, further comprising:

a depletable extension zone of the conductivity type of the body/anode zones, directly adjoining the non-depletable extension zone, and arranged between the non-depletable extension zone and the side surface.

18. The semiconductor device of claim 17, wherein the depletable extension zone contains an effective dopant dose of at most $2.0E12$ cm$^{-2}$.

* * * * *